United States Patent [19]

Alter

[11] Patent Number: 4,914,546
[45] Date of Patent: Apr. 3, 1990

[54] STACKED MULTI-POLYSILICON LAYER CAPACITOR

[75] Inventor: Martin J. Alter, Los Altos, Calif.

[73] Assignee: Micrel Incorporated, Sunnyvale, Calif.

[21] Appl. No.: 306,375

[22] Filed: Feb. 3, 1989

[51] Int. Cl.⁴ .................. H01G 4/10; H01L 27/02
[52] U.S. Cl. ................................ 361/313; 357/51
[58] Field of Search .............. 357/51; 361/313, 328, 361/330

[56] References Cited

U.S. PATENT DOCUMENTS

| 4,475,964 | 10/1984 | Arizumi et al. ............... 357/51 X |
| 4,805,071 | 2/1989 | Hutter et al. ................. 361/313 |

FOREIGN PATENT DOCUMENTS

| 124255 | 9/1980 | Japan ............................ 357/51 |
| 5989450 | 5/1984 | Japan. | |
| 105263 | 6/1985 | Japan ............................ 357/51 |

Primary Examiner—Donald A. Griffin
Attorney, Agent, or Firm—Skjerven, Morrill, MacPherson, Franklin & Friel

[57] ABSTRACT

A multilayer polysilicon structure is formed, where the various polysilicon layers and a conductive diffused region form plates of stacked capacitors, and electrodes contact each of the capacitor plates. The resulting capacitor structure inherently forms a series connected capacitor structure where each capacitor shares a plate with an adjacent capacitor. The structure is well suited for use in a voltage multiplier where each capacitor is charged to the supply voltage with the total voltage across the series connected capacitors being a multiple of the supply voltage. The dielectric layer between each of the polysilicon layers and between the first polysilicon layer and the diffused region may be nitride, oxide, or a combination of both.

19 Claims, 2 Drawing Sheets

STACKED MULTI-POLYSILICON LAYER CAPACITOR

FIELD OF THE INVENTION

This invention relates to capacitors and in particular to a multiple-polysilicon layer capacitor especially suited for use in voltage multipliers or circuits requiring voltage multipliers.

BACKGROUND OF THE INVENTION

It is frequently desired in the microelectronics industry to use only a single voltage (e.g., five volt) external power supply to supply all the power needs for a microcircuit. It is further desirable to fabricate on-chip voltage multiplier circuits to provide a voltage which is higher than the external power supply voltage to drive, for example, a gate of an NMOS transistor for higher output current throughput or to provide high erase and write voltages for electrically erasable programmable read-only memories (EEPROMs).

FIG. 1 is a schematic diagram of a representative voltage doubler which may be implemented in an integrated circuit. Voltage doubler 10 of FIG. 1 uses the voltage across two series connected capacitors C1 and C2 as its output. The remainder of the voltage doubler 10 circuitry acts to charge each capacitor C1 and C2 individually to the supply voltage $V_{cc}$ when square wave signals 12 and 14, 180° out-of-phase with each other and both with an amplitude of supply voltage $V_{cc}$, are applied to the input terminals of voltage doubler 10. Thus, each of the two signals 12 and 14 charge respective capacitors C1 and C2 to the peak supply voltage $V_{cc}$ of, for example, five volts so that the voltage across the series connected capacitors C1 and C2 is roughly twice that of the amplitude of signals 12 and 14—in this case, ten volts. If a voltage tripler was desired, three out-of-phase signals would be required to charge up three series connected capacitors to the power supply voltage to produce roughly triple the power supply voltage across the capacitors.

Prior art voltage multiplier structures form each of the capacitors by providing a highly conductive polysilicon layer over, and insulated from, a highly conductive diffused region, as shown in FIG. 2. In FIG. 2, polysilicon layers 20 and 22 act as upper plates of capacitors C1 and C2 while diffused regions 24 and 26 act as bottom plates of the capacitors. Electrodes 28, 30, 32, and 34 provide the proper coupling to the diffused regions and the polysilicon upper plates. As greater voltage multiplication is desired, more and more capacitors are required, resulting in more real estate being used to accommodate the necessary number of capacitors. Further, each individual capacitor is affected by a parasitic capacitance between the diffused region and the substrate.

In Japanese Patent No. 59-89450 to Miyamoto, a multilayer capacitor of a large capacitance is shown in which a diffused region in a substrate forms a lower plate of a first capacitor. An insulating layer is formed over this diffused region and a first polysilicon layer is formed thereon, forming an upper plate of the first capacitor and an upper plate of a second capacitor. A second polysilicon layer is formed over and insulated from the first polysilicon layer to form a lower plate of the second capacitor and a lower plate of a third capacitor. A third polysilicon layer is formed over and insulated from the second polysilicon layer to form the upper plate of the third capacitor and an upper plate of a fourth capacitor. A fourth polysilicon layer forms the lower plate of the fourth capacitor. The diffused region, the second polysilicon layer, and the fourth polysilicon layer are coupled together via a first electrode, and the first polysilicon layer and the third polysilicon layer are coupled together with a second electrode. This arrangement in Miyamoto results in the equivalent of four capacitors connected in parallel, wherein the resulting large capacitor has only two terminals for connection to other circuitry. This type of capacitor cannot be used in a voltage multiplier circuit to form capacitors C1 and C2 in FIG. 1 since capacitors C1 and C2 must be in series.

No prior art voltage multiplier has utilized multiple polysilicon layers in the formation of serial capacitances, and further, no prior art has been found which discloses multiple polysilicon layers in the formation of individual discrete capacitors which are in a stacked structure.

SUMMARY OF THE INVENTION

A multilayer polysilicon structure is formed, wherein the various polysilicon layers and a conductive diffused region form plates of stacked capacitors. Individual electrodes are used to contact the various plates of the capacitors so that the capacitors may be used as series connected capacitors for use in a voltage multiplier circuit. With this capacitor structure, die area is conserved by the stacking of capacitors.

A further advantage of this structure is that a parasitic capacitance only exists between the conductive diffused region and the substrate. The remaining overlying capacitors will not be affected by parasitic capacitance since each conductive polysilicon layer acts as a shield plate.

Capacitance values may be easily selected by adjusting the thickness of a dielectric layer between each conductive capacitor plate and/or adjusting the area of a capacitive plate. Oxide alone may be used as the dielectric; however, breakdown voltage may be made high by using nitride as the insulation layer or using nitride in conjunction with oxide as the insulation layer. In some cases it may be appropriate to make multiple dielectric layers, such as oxide/nitride/oxide. Since nitride has a relatively high dielectric constant as compared to silicon dioxide, using nitride in the insulation layer also provides a higher capacitance for a given thickness of dielectric.

In one embodiment of a method to form these capacitors, each formed polysilicon capacitor plate is used as a mask during etching of the underlying dielectric.

DETAILED DESCRIPTION OF THE INVENTION

Figure 3:
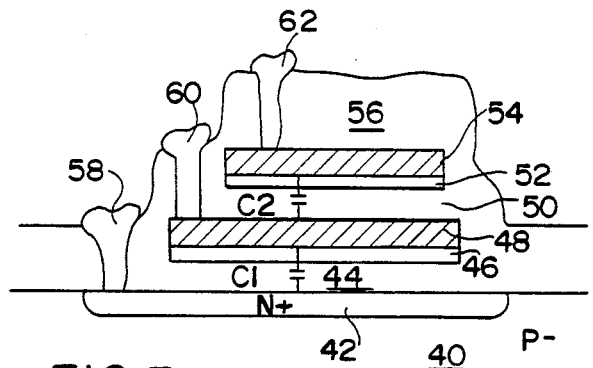
FIG. 3 is one embodiment of my inventive stacked capacitor structure.

Shown in FIG. 3 is one embodiment of the invention including P- substrate 40 having formed therein N+ diffused region 42. N+ diffused region 42 has a high conductivity and acts as a lower plate of a first capacitor C1, shown in dashed outline. The substrate 40 and the high conductivity diffused region 42 may be made N- and P+ types, respectively, if so desired. Over N+ region 42 is formed gate oxide layer 44, and over gate oxide layer 44 is formed nitride ($Si_3N_4$) layer 46.

First polysilicon layer 48 is formed over nitride layer 46 to form the upper plate of capacitor C1 and the lower plate of capacitor C2. A layer of oxide 50 is then formed over polysilicon layer 48, and a layer of nitride 52 is then formed over oxide layer 50.

Second polysilicon layer 54 is then formed over nitride layer 52 and forms an upper plate of capacitor C2. A field oxide layer 56 is formed over the surface of the structure. Contact holes are etched in field oxide layer 56 and metal electrodes 58, 60, and 62 are formed to contact diffused region 42, first polysilicon layer 48, and second polysilicon layer 54, respectively.

Layers 48 and 54 may also be formed as layers of polycide (metalized polysilicon) or metal, such as Ti, TiW, or SiCr.

By adjusting the areas of the various capacitor plates and the thicknesses of the dielectric layers between the various capacitor plates, capacitances C1 and C2 may be adjusted as desired in accordance with Equation (1) below.

$$C = AK\epsilon_0/t, \qquad (1)$$

where

C is the capacitance,
$\epsilon_0$ is the permittivity of empty space ($8.85 \times 10^{-2}$ coul$^2$/newton$^2$-m$^2$),
K is the dielectric constant (3.9 for $SiO_2$; 7.0 for $Si_3N_4$),
A is the plate area, and
t is the dielectric thickness.

The nitride-on-oxide redundancy provides improved yield, and, since nitride has a higher dielectric constant than silicon dioxide, the use of nitride dielectric layers enables a high capacitance between plates for a given dielectric thickness, as well as increasing breakdown voltage. This increased breakdown voltage becomes very important in higher-voltage applications.

Figure 1:
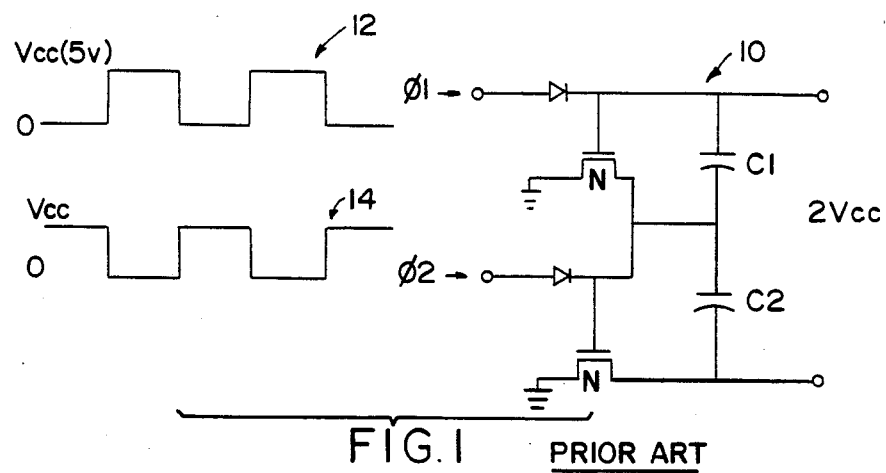
FIG. 1 is a schematic diagram of a voltage multiplier using a series combination of capacitors.
Figure 2:
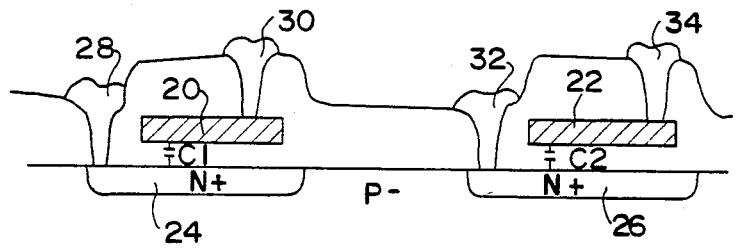
FIG. 2 is a cross-section of a prior art multiple capacitor structure.

The structure of FIG. 3 may be used in, for example, the voltage multiplier of FIG. 1. Additional dielectric and polysilicon layers may be formed, and contacts made thereto, to form any number of serially connected capacitors. Additionally, the polysilicon layers may be connected together in a metallization step to form any combination of series-connected or parallel-connected capacitors as required by the voltage multiplier circuit.

An additional feature of the structure of FIG. 3 is that a parasitic capacitance only exists between N+ region 42 and P- substrate 40, due to the depletion region at the junction of N+ region 42 and P- substrate 40. Hence, parasitic capacitance is held to a minimum.

In another embodiment of the invention, N+ region 42 may be eliminated so that first polysilicon layer 48 acts as a bottom plate of a first capacitor. An additional third polysilicon layer would be necessary to form two stacked capacitors. In this way parasitic capacitance would be eliminated.

In another embodiment of this invention, polysilicon layer 48 or 50 may be additionally used as a field-shield by being extended to be overlying and insulated from a remote diffused region to protect the diffused region from external electric fields caused by voltage through connecting lines proximate the remote diffused region.

Figure 4:
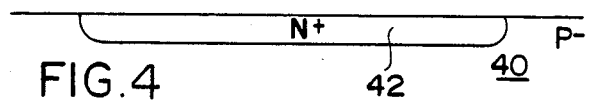
FIGS. 4-6 shows process steps in the formation of the embodiment of FIG. 3.
Figure 5:
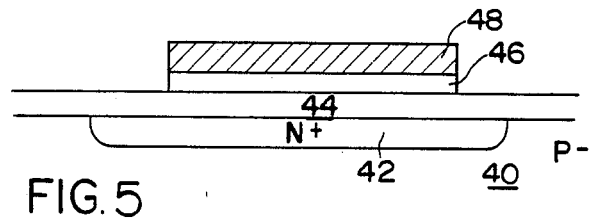
Figure 6:
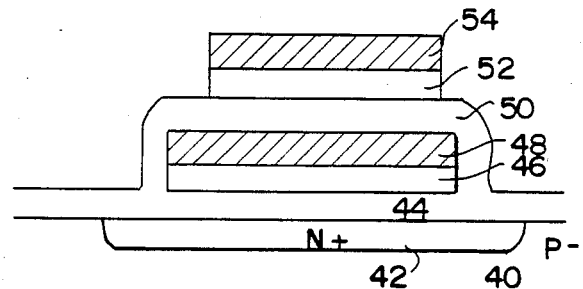

One method of forming the stacked capacitor structure of FIG. 3 is shown in FIGS. 4-6. In FIG. 4, P-substrate 40 has diffused or implanted into it N-type impurities, such as arsenic or phosphorus, to form N+ region 42. Any number of well known processes for masking, etching, and diffusion or implantation may be used. The concentration of impurities in N+ region 42 in one embodiment is approximately $2E19/cm^3$ in order to provide the necessary high conductivity of N+ region 42.

In FIG. 5, gate oxide 44 is then formed over N+ region 42 to a thickness of approximately 200-800Å by thermal oxidation or other well known process. This gate oxide layer 44 may be the same thickness as gate oxide grown elsewhere on the substrate for use as gate oxide in an MOS transistor. Next, nitride ($Si_3N_4$) layer 46 is deposited over gate oxide 44 using, for example, low pressure chemical vapor deposition (CVD), to provide the high dielectric strength and high capacitance between a subsequently formed polysilicon layer and N+ region 42. Depending on the desired dielectric characteristics, nitride layer 46 may be between 0-1000Å thick.

Next, first polysilicon layer 48 is deposited over nitride layer 46, using conventional processes, and etched to provide the desired effective capacitor plate area. A blanket etching process may then be used to etch nitride layer 46 using polysilicon layer 48 as a mask.

First polysilicon layer 48 must have a high enough impurity concentration to render first polysilicon layer 48 highly conductive. Doping of first polysilicon layer 48 may be performed using well known techniques, either while first polysilicon layer 48 is being deposited or after first polysilicon layer 48 has been deposited.

In FIG. 6, the structure of FIG. 5 has grown over it oxide layer 50 using, for example, thermal oxidation, and over oxide layer 50 is deposited nitride layer 52 using, for example, a low pressure CVD process. Thicknesses of oxide layer 50 and nitride layer 52 may or may not be identical to the thicknesses of gate oxide 44 and nitride layer 46, depending on the desired characteristics of the dielectric separating first polysilicon layer 48 from second polysilicon layer 54. Second polysilicon layer 54 is then deposited over the surface of the wafer and etched to provide the desired effective capacitor plate area. Second polysilicon layer 54 is doped to have a high impurity concentration using well known techniques. The surface of the wafer is then etched to remove nitride layer 52 using second polysilicon layer 54 as a mask so as to only leave nitride under second polysilicon layer 54. In some cases it may be appropriate to leave nitride layer 52 overlying the entire wafer surface, but contact holes must then be etched through this additional layer.

As shown in FIG. 3, field oxide 56 is then grown over the surface of the wafer using thermal oxidation, and contact holes are etched to allow the desired contact to N+ region 42, first polysilicon layer 48, and second polysilicon layer 54. Electrodes 58, 60, and 62, filling the contact holes, are then formed using a standard metallization process.

In another embodiment of the invention only silicon nitride or silicon dioxide forms the total dielectric between polysilicon layers 48 and 54 and between N+ region 42 and first polysilicon layer 48 in the structure of FIG. 3.

This inventive stacked capacitor is not restricted to two layers of polysilicon but may be expanded to encompass stacked capacitors with any number of polysilicon layers. Further, even though nitride on oxide has been shown, other dielectric materials, composites, or sandwiches possessing desirable characteristics may also be used.

Variations and modifications to the embodiments shown in the figures and discussed herein may be made for various reasons by persons of ordinary skill in the art while still keeping within the scope of this invention. The scope of this invention is only limited by the following claims.

I claim:

1. A capacitor structure comprising:
   a highly conductive diffused region formed in a substrate, said diffused region and said substrate being of opposite conductivity types;
   a first layer of insulation formed over said diffused region;
   a first layer of highly conductive material formed over said first layer of insulation;
   a second layer of insulation formed over said first layer of highly conductive material;
   a second layer of highly conductive material formed over said second layer of insulation; and
   first, second, and third electrodes contacting said diffused region, said first layer of highly conductive material, and said second layer of highly conductive material, respectively.

2. The capacitor structure of claim 1 wherein said first layer of insulation comprises a gate oxide layer and a silicon nitride layer formed over said gate oxide layer.

3. The capacitor structure of claim 1 wherein said second layer of insulation comprises a layer of oxide and a layer of silicon nitride overlying said oxide layer.

4. The capacitor structure of claim 1 wherein said highly conductive material is doped polysilicon.

5. The capacitor structure of claim 1 wherein said highly conductive material is a metal.

6. The capacitor structure of claim 1 wherein said highly conductive material is polycide.

7. A capacitor structure comprising:
   a highly conductive diffused region formed in a substrate, said diffused region and said substrate being of opposite conductivity types;
   a first layer of insulation formed over said diffused region;
   a first layer of highly conductive material formed over said first layer of insulation;
   a plurality of combination layers stacked over said first layer of highly conductive material, each of said combination layers comprising a layer of insulation with an overlying layer of highly conductive material; and
   electrodes contacting said diffused region, said first layer of highly conductive material, and each of said layers of highly conductive material within said combination layers, said electrodes not coupling any combination of said layers of highly conductive material together.

8. The capacitor structure of claim 7 wherein said first layer of insulation comprises a gate oxide layer and a silicon nitride layer formed over said gate oxide layer.

9. The capacitor structure of claim 7 wherein said layer of insulation within each of said combination layers comprises a layer of oxide and a layer of silicon nitride overlying said oxide layer.

10. The capacitor structure of claim 7 wherein at least one of said layers of insulation comprises a sandwich layer of oxide/nitride/oxide.

11. The capacitor structure of claim 7 wherein said highly conductive material is doped polysilicon.

12. The capacitor structure of claim 7 wherein said highly conductive material is metal.

13. The capacitor structure of claim 7 wherein said highly conductive material is polycide.

14. A monolithic voltage multiplier comprising:
   a serial combination of stacked capacitors, each of said capacitors having an upper capacitor plate and a lower capacitor plate, each of said upper capacitor plates having an electrode in contact therewith, said electrodes not coupling any of said upper and lower capacitor plates together; and
   means for charging each of said capacitors in said serial combination of stacked capacitors to a power supply voltage so that voltage across said serial combination of stacked capacitors will be a multiple of said power supply voltage,
   said serial combination of stacked capacitors comprising,
   a highly conductive diffused region formed in a substrate, said diffused region and said substrate being of opposite conductivity types;
   a first layer of insulation formed over said diffused region;
   a first layer of highly conductive material formed over said first layer of insulation; and
   a plurality of combination layers stacked over said first layer of highly conductive material, each of said combination layers comprising a layer of insulation with an overlying layer of highly conductive material, said electrodes contacting said diffused region, said first layer of highly conductive material, and each of said layers of highly conductive material within said combination layers.

15. A monolithic voltage multiplier comprising:
   a serial combination of stacked capacitors, each of said capacitors having an upper capacitor plate and a lower capacitor plate, each of said upper capacitor plates having an electrode in contact therewith, said electrodes coupling a combination of said upper and lower capacitor plates together to provide desired voltage ratioing for said voltage multiplier; and
   means for charging each of said capacitors in said serial combination of stacked capacitors to a power supply voltage so that voltage across said serial combination of stacked capacitors will be a multiple of said power supply voltage,
   said serial combination of stacked capacitors comprising,
   a highly conductive diffused region formed in a substrate, said diffused region and said substrate being of opposite conductivity types;
   a first layer of insulation formed over said diffused region;
   a first layer of highly conductive material formed over said first layer of insulation; and
   a plurality of combination layers stacked over said first layer of highly conductive material, each of said combination layers comprising a layer of insulation with an overlying layer of highly conductive material, said electrodes contacting said diffused region, said first layer of highly conductive material, and each of said layers of highly conductive material within said combination layers.

16. A monolithic voltage multiplier comprising:
a serial combination of stacked capacitors, each of said capacitors having an upper capacitor plate and a lower capacitor plate, each of said upper capacitor plates having an electrode in contact therewith, said electrodes not coupling any of said upper and lower capacitor plates together; and
means for charging each of said capacitors in said serial combination of stacked capacitors to a power supply voltage so that voltage across said serial combination of stacked capacitors will be a multiple of said power supply voltage,
said serial combination of stacked capacitors comprising,
a substrate;
a first layer of insulation formed over said substrate;
a first layer of highly conductive material formed over said first layer of insulation; and
a plurality of combination layers stacked over said first layer of highly conductive material, each of said combination layers comprising a layer of insulation with an overlying layer of highly conductive material, said electrodes contacting said first layer of highly conductive material and each of said layers of highly conductive material within said combination layers.

17. The capacitor structure of claim 14, 15, or 16 wherein said highly conductive material is doped polysilicon.

18. The capacitor structure of claim 14, 15 or 16 wherein said highly conductive material is a metal.

19. The capacitor structure of claim 14, 15 or 16 wherein said highly conductive material is polycide.

* * * * *